United States Patent [19]
Chonan

[11] Patent Number: 5,463,588
[45] Date of Patent: Oct. 31, 1995

[54] DYNAMIC MEMORY DEVICE HAVING A PLURALITY OF INTERNAL POWER SOURCES

[75] Inventor: Toru Chonan, Tokyo, Japan

[73] Assignee: NEC Corporation, Tokyo, Japan

[21] Appl. No.: 321,813

[22] Filed: Oct. 3, 1994

[30] Foreign Application Priority Data

Oct. 6, 1993 [JP] Japan .................................. 5-276109

[51] Int. Cl.$^6$ .................................................. G11C 11/40
[52] U.S. Cl. .................... 365/226; 365/229; 365/189.09; 365/207; 365/208
[58] Field of Search .................................. 365/226, 227, 365/228, 229, 189.09, 189.11, 207, 208; 323/281, 314, 315, 316; 327/51, 52

[56] References Cited

U.S. PATENT DOCUMENTS

| | | | |
|---|---|---|---|
| 4,683,382 | 7/1987 | Sakurai et al. | 365/227 |
| 4,933,902 | 6/1990 | Yamada et al. | 365/226 |
| 5,077,518 | 12/1991 | Han | 365/226 |
| 5,295,112 | 3/1994 | Taniguchi | 365/227 |

*Primary Examiner*—David C. Nelms
*Assistant Examiner*—Vu A. Le
*Attorney, Agent, or Firm*—Young & Thompson

[57] ABSTRACT

Disclosed therein is a dynamic memory device having an internal power source circuit generating an internal power voltage which is smaller than an external power voltage applied to the device and supplied to an internal memory circuit as an operating voltage. The internal power source circuit includes a differential amplifier for stabilizing the internal power voltage in response to a reference voltage, and a current flowing through the differential amplifier is controlled to a first value during a standby mode, a second value larger than the first value during a data sensing operation and restoring (refreshing) operation of an active mode, and a third value larger than the first value but smaller than the second value during the other operation of the active mode.

10 Claims, 6 Drawing Sheets

DYNAMIC MEMORY DEVICE HAVING A PLURALITY OF INTERNAL POWER SOURCES

BACKGROUND OF THE INVENTION

1. Field of the Invention

The present invention relates to a semiconductor memory device and, more particularly, to a dynamic random access memory device having an internal power source which steps down or reduces the level of a power supply voltage applied to the memory from an outside (i.e., an external power supply voltage) and produces and supplies an internal power voltage to an internal circuit of the memory device as an operating power voltage.

2. Description of the Prior Art

It is well known in the art that latest dynamic memory devices constituted of MOS transistors employ a technique in which an internal power source circuit is used to reduce an external power supply voltage and supply an internal power voltage having a stepped-down voltage level to an internal memory circuit as an operating power voltage for the prevention of gate oxide film rupture and the occurrence of hot carriers and also for the reduction of power dissipation. Although this technique is very useful for fine pattern MOS transistors as well as in view of suppression of power consumption, the internal power voltage thus produced is required to be stabilized against the change in impedance of the internal memory circuit. For this purpose, the internal power source circuit utilizes a differential amplifier circuit which compares the internal power voltage with a reference voltage to stabilize the internal power voltage. That is, the internal power source performs a linear operation and thus consumes a d.c. power irrespective of access to the memory.

As is also well known in the art, the memory device has not only an active operation mode in which a data read and write access operations are performed, but also a standby mode waiting for the data read/write access. The power consumed by the memory device, in particular the power dissipation in the standby mode, is desirable to be as small as possible especially in a battery-operated apparatus or system.

However, the internal power source circuit always consumes power, as mentioned above. In the active operation mode, the power consumed by the internal power source circuit is very small as compared to that consumed by the internal memory circuit responsive to an access request. In the standby mode, on the other hand, a power consumed by the internal circuit becomes smaller, and hence the power consumed by the internal power source becomes a problem. The power consumed by the internal power source is, therefore, required to be cut down during standby mode.

For this purpose, such an internal power source circuit as shown in FIG. 6A has been proposed. This internal power source includes a first power supply circuit 1 and a second power supply circuit 2. The first power supply circuit 1 includes a differential amplifier circuit 11 operating on an external power voltage VCC. This amplifier 11 comprises a differential pair of N-channel MOS (called hereinafter "NMOS") transistors Q11 and Q12, an NMOS transistor Q13 as a constant current source, a pair of P-channel MOS (called hereinafter "PMOS") transistors Q14 and Q15 constituting a current mirror as a load, and a PMOS driver transistor 12 serving as an output buffer transistor to produce an internal power voltage VINT which is in turn supplied to the internal memory circuit (not shown). The transistor Q11 receives at its gate the internal power voltage VINT, and the transistor Q12 receives at its gate a reference voltage VREF. This reference voltage VREF is generated by a reference voltage generator (not shown) of a well-known band-gap regulator type and thus stabilized against the variation in external power voltage VCC as well as in an operating temperature. The reference voltage VREF is further supplied to the gate of the transistor Q13 to make it operate as a constant current source producing a current I1. Thus, the internal voltage VINT is controlled by the amplifier 11 to have the level equal to the reference voltage VREF by a negative feed loop.

The second power supply circuit 2 also includes a differential amplifier circuit 21. This circuit 21 comprises a differential pair of NMOS transistors Q21 and Q20 receiving the internal power voltage VINT and the reference voltage VREF, respectively, an NMOS transistor Q23 supplied at its gate with the reference voltage VREF and thus serving as a constant current source producing a constant current I2, a pair of PMOS transistors Q24 and Q25 operating as a current mirror circuit as a load, and a PMOS transistor 22 serving as an output buffer transistor coupled to the line to supply the internal power voltage VINT. Thus, the internal voltage VINT is further controlled to be equal to the reference voltage VREF.

Unlike the first internal power circuit 1, however, the second power circuit 2 further includes an NMOS transistor Q26 connected in series to the transistor Q23 and a PMOS transistor Q27 connected between the gate of the transistor 22 and the power line VCC. Still further, a control signal $\phi 0$ is supplied to the gates of the transistors Q26 and Q27. This control signal $\phi 0$ is derived by inverting a row address strobe signal RAS, as shown in FIG. 6B. This signal RAS is of a low active type. That is, address information supplied to a set of address input terminals (not shown) are fetched and latched as row address information in synchronism with the change of the row address strobe signal RAS from the high level to the low level, as well known in the art. The data read/write access operation is thereby initiated. On the other hand, the change of the signal RAS from the low level to the high level indicates the completion of the access operation and the standby mode. Accordingly, the transistors Q26 and Q27 are respectively turned ON and OFF during the time period in the active operation mode, and OFF and ON during the time period in the standby mode.

Thus, the first power circuit 1 is activated to operate not only in the active operation mode but also in the standby mode, whereas the second power circuit 2 is activated to operate only in the active operation mode and deactivated in the standby mode. In the standby mode, no access operation is performed and thus the internal memory circuit is in a steady state. That is, there is no substantial change in impedance of the internal memory circuit. Therefore, the first power supply 1 is sufficient to have small response speed and driving capability for stabilizing the internal power voltage VINT. The current I1 flowing through the transistor Q13, i.e., the operating current of the amplifier 11 is thus designed to be small to suppress the power dissipation consumed by the internal power source circuit in the standby mode. The constant current I1 is typically designed to be about 100 μA.

On the other hand, in the active operation mode, the impedance of the internal memory circuit is considerably changed by the data read/write access. In order to stabilize the internal power voltage VINT against that impedance change, therefore, the internal power voltage VINT is required to be produced with large driving capability. To this end, the second power circuit 2 is also activated to control the internal power voltage VINT by the control signal φ0, as shown in FIG. 6(B). The high level control signal φ0 turns the transistor Q26 ON and the transistor Q27 OFF, as mentioned before. When the second power circuit 2 is activated, the driver transistor 22 is designed to have a large driving ability to stabilize the internal power voltage VINT, and it is generally ten times in the driving ability as large as the driver transistor 12 of the first circuit 1. Moreover, the amplifier circuit 21 is also designed to have a high response speed by being supplied with the large constant current I2 through the transistors Q23 and Q26. The constant current I2 is designed to be typically about 1 to 2 mA.

Thus, the dissipation current becomes I1+I2 during the time in the active operation mode and I1 during the time in the standby mode, as shown in FIG. 6(B), so that a wasteful current does not flow during the standby mode. The reduction of the power consumption of the internal power source is thereby achieved.

However, further reduction in power consumption is a big concern in current memory devices. Such a memory device requires as much power consumption reduction as possible.

BRIEF SUMMARY OF THE INVENTION

OBJECT OF THE INVENTION

It is therefore an object of the present invention to provide a semiconductor memory device in which the power consumption thereof is further reduced.

It is another object of the present invention to provide a dynamic random access memory having an internal power source circuit for producing an internal power voltage smaller than an external power voltage with further reduced power dissipation.

SUMMARY OF THE INVENTION

A semiconductor memory device according to the present invention has a standby mode and an active operation mode which has a first period following the initiation of the active operation mode and a second period after the first period and comprises a memory circuit and an internal power source circuit producing an internal power voltage that is smaller than an external power voltage applied to the memory device and supplying the internal power voltage to the memory circuit, the internal power source circuit having a power circuit for stabilizing the internal power voltage with a response speed relative to a current flowing therethrough and a current control circuit controlling the current flowing through the power circuit to a first value during the standby mode, a second value larger than the first value during the first period of the active operation mode and a third value larger than the first value but smaller than the second value during the second period of the active operation mode.

Thus, the present invention is featured by that the active operation mode is divided into the first and second periods and the current flowing through the power circuit is controlled and changed correspondingly to these periods. This feature is based upon the following observation: More specifically, when the active operation mode is initiated, a word line corresponding to the row address information is energized and a set of sense amplifiers are then activated to amplify the data signals read out from memory cells coupled to the energized word line and then restore (i.e., refresh) to restore the data signal into those memory cells. During this sequence of internal operations, a large current flows through the memory circuit. That is, the internal power circuit is subject to a big change in impedance of a load circuit (i.e., memory circuit) during this sequence of internal operations. After this, the change in impedance of the memory circuit is not so big because a data output operation from the selected memory cell or the data write operation thereinto is merely performed. Accordingly, the first period covers the above-mentioned sequence of internal operations and the second period covers the period after the first period. During the first period, the power circuit is supplied with the current having the second, biggest current, so that the internal power voltage VINT is quickly stabilized against the change in impedance of the memory circuit. During the second period, since the power circuit is in turn supplied with the current having the third value smaller than the second value, the power consumption during this period is reduced. It is of course that the power circuit is supplied with the first, minimum current in the standby mode. Thus, the power consumption of the memory device according to the present invention is further reduced in the active operation mode, as compared to the prior art memory device.

BRIEF DESCRIPTION OF THE DRAWINGS

This above-mentioned and other objects, features and advantages of the present invention will become more apparent by reference to the following detailed description of the invention taken in conjunction with the accompanying drawings, wherein.

DETAILED DESCRIPTION OF THE PREFERRED EMBODIMENTS

Figure 1:
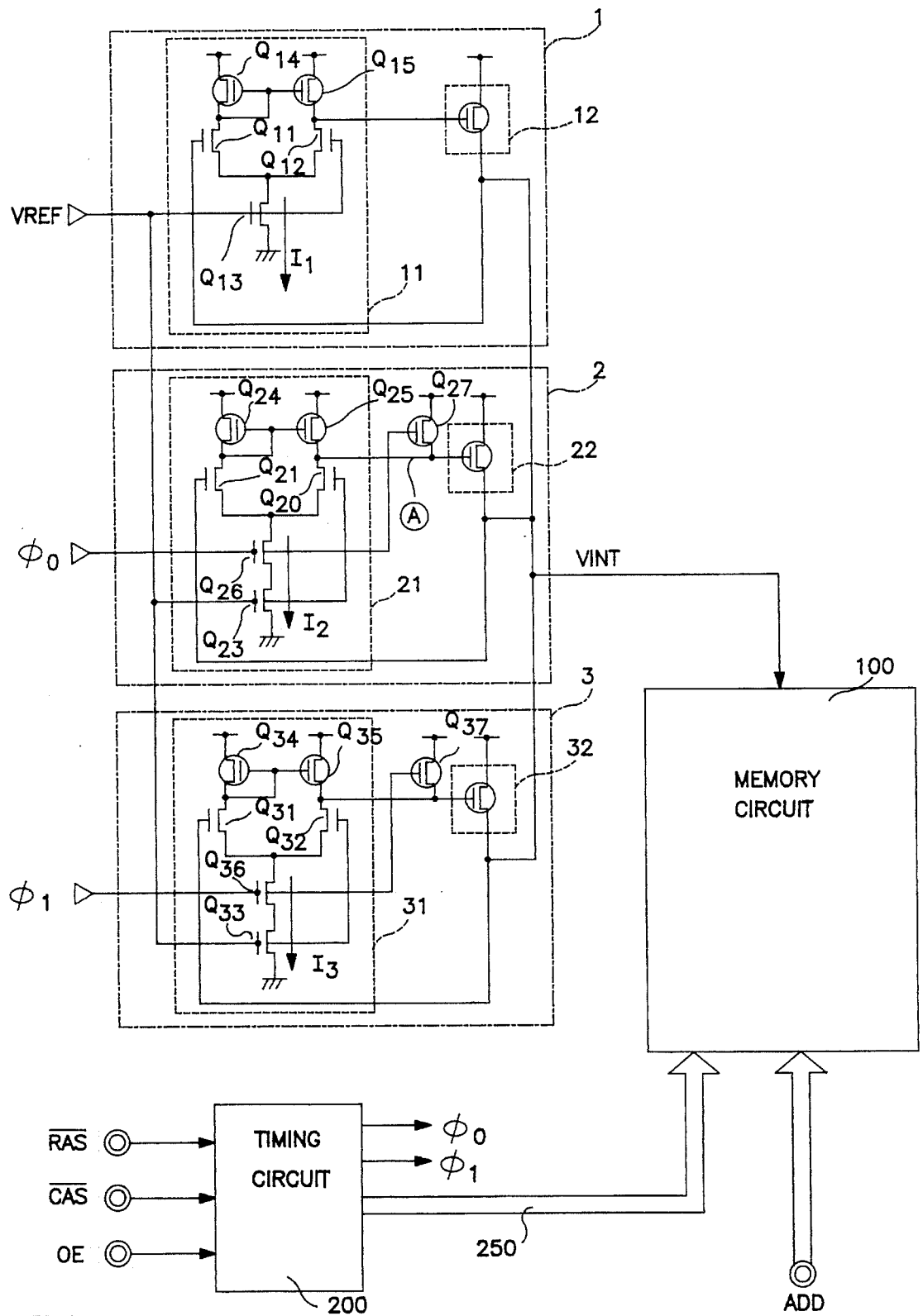
FIG. 1 is a circuit diagram showing a dynamic memory device according to an embodiment of the present invention.
Figure 6A:
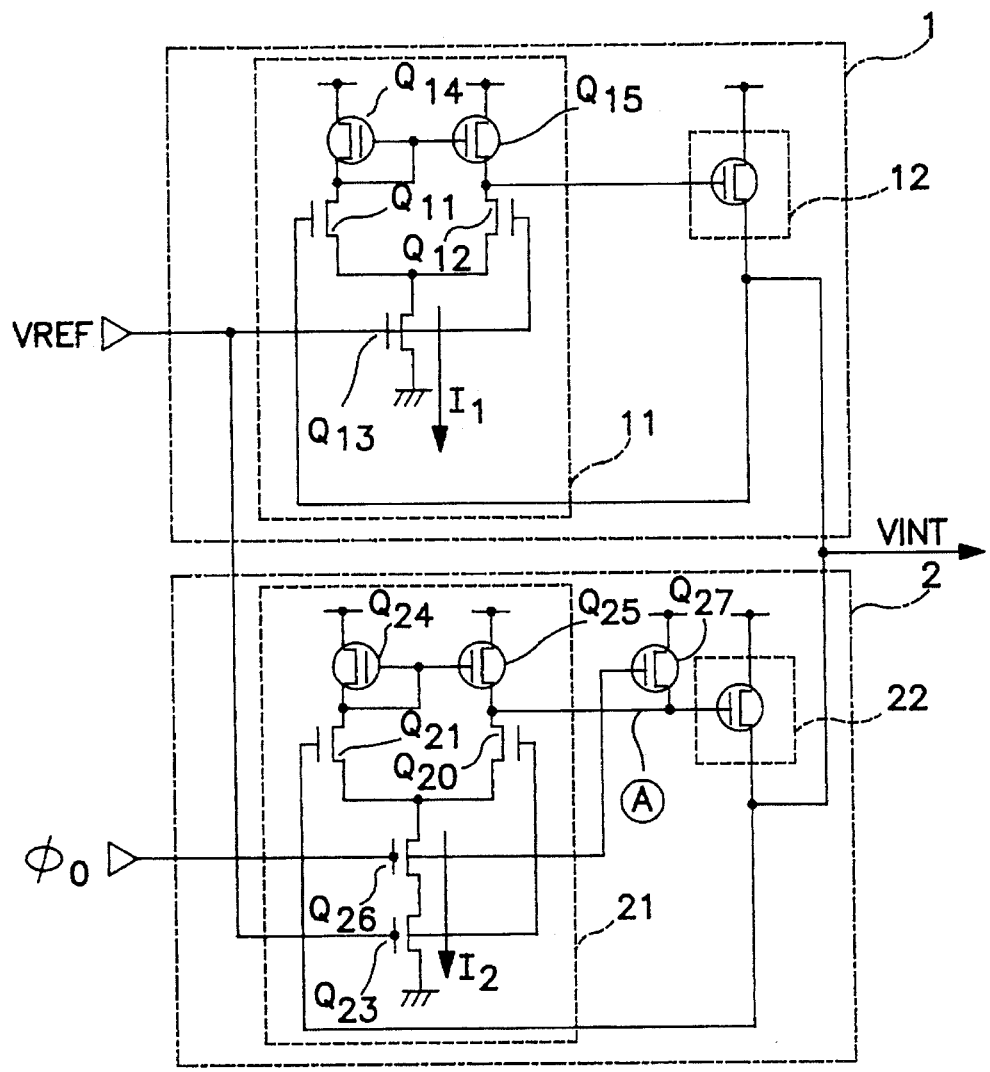
FIG. 6A is a circuit diagram showing a conventional dynamic memory device and FIG. 6B is a timing diagram showing the operation of the memory device thereof.
Figure 6B:
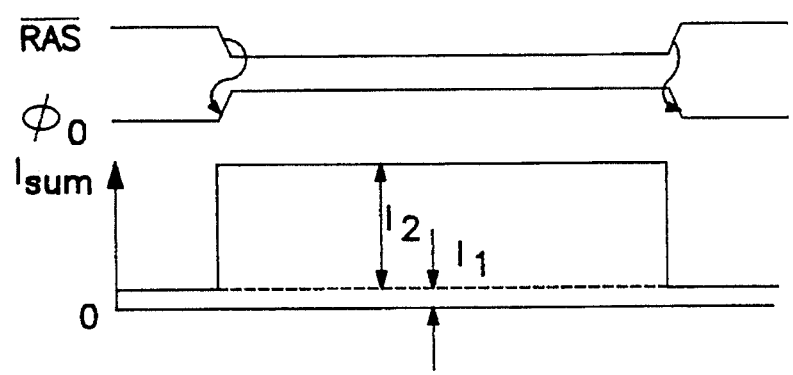

Referring to FIG. 1, there is shown a dynamic random access memory device according to an embodiment of the present invention, in which parts corresponding to the parts of the memory device shown in FIG. 6 will be denoted by the same reference numerals and letters to omit the necessity of further description thereof. In this embodiment, there is further provided a third power supply circuit 3 in addition to the first and second power supply circuits 1 and 2. This circuit 3 also includes a differential amplifier circuit 31 and a driver 32 responding to the output of the circuit 31 and controlling the internal power voltage VINT. The internal power voltage VINT is applied to a memory circuit 100 as an operating power voltage. Although not shown, The memory circuit 100 includes a memory cell array including a plurality of memory cells arrayed in a matrix form and peripheral circuits such as an address buffer/decoder, a set of sense amplifiers and a data read/write circuit, as well known in the art. The third power supply circuit 3 further includes a PMOS transistor Q37 connected between the gate of the driver transistor 32 and the external power voltage line VCC.

The amplifier circuit 31 includes a differential pair of NMOS transistors Q31 and Q32, an NMOS transistor Q33 operating as a constant current source, and a pair of PMOS transistors Q34 and Q35 constituting a current mirror as a load. This circuit 31 further includes an NMOS transistor Q36 connected in series to the transistor Q33. The transistors Q36 and Q37 are supplied at the gates thereof with a control signal $\phi 1$.

The present memory device further includes a timing signal generator 200. This circuit 200 responds to external control signals, a row address strobe signal RAS, a column address strobe signal CAS and an output-enable signal OE, and generates and supplies a set of internal control signals 250 to the memory circuit 100 to perform a data access operation. Specifically, when the row address strobe signal RAS changes from the high level to the low level, the address information supplied to a set of address terminals ADD is fetched and latched in the memory circuit 100 as a row address. When the column address strobe signal CAS changes from the high level to the low level during the low level of the signal RAS, the address information is fetched in the memory circuit 100 as a column address. The timing circuit 200 further responds to the change of the row address strobe signal RAS from the high level to the low level and generates first, second and third timing control signals o0 and o1 in accordance with the present invention.

Figure 2:
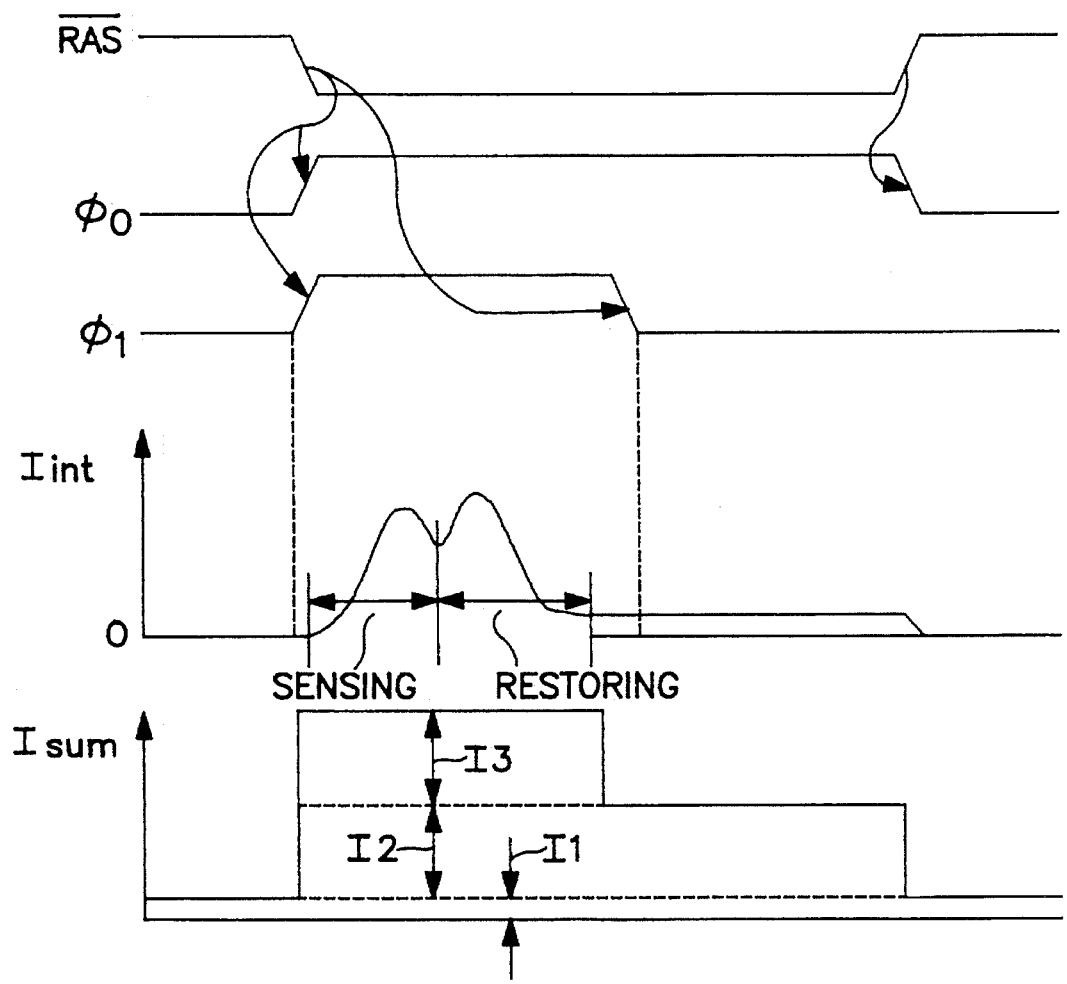
FIG. 2 is a timing diagram illustrating an operation of memory device shown in FIG. 1.

As shown in FIG. 2, the control signal $\phi 0$ is equivalent to an invented signal of the signal RAS, whereas the control signal $\phi 1$ is changed to the high level in response to the change of the signal RAS to the low level and returned to the low level after a predetermined period of time has been elapsed. The period during the high level of the signal $\phi 1$ is designed to cover the sequence of internal operations including the energization of a selected word line(s) and the activation of the sense amplifiers, as described hereinbefore. In this embodiment, the period of the high level of the signal $\phi 1$ is designed to be about 50 ns.

With a circuit as described above, the first power supply circuit 1 is always driven in the standby mode and in the active operation mode. Since the memory circuit 100 performs vertically no operation in the standby mode, an internal current Iint flowing through the memory circuit 100 is vertically zero as shown in FIG. 2 and the internal power voltage VINT vertically does not fluctuate. Accordingly, the driver transistor 12 has a relatively small size to indicate a small driving ability. Moreover, the amplifier circuit 11 has its response speed determined by a constant current I1 and designed to be very slow, for example, 50 ns, since the VINT is stable in the standby mode as described hereinbefore. Therefore, the constant current I1 can be made small to the extent that VINT does not become unstable, and the constant current I1 can typically be reduced to about 100 μA.

In the standby mode, the second power supply 2 is deactivated by the control signal $\phi 0$. More particularly, as shown in FIG. 2, the control signal $\phi 0$ takes a low level in standby mode, and this low level signal $\phi 0$ turns the transistor Q26 OFF, so that no constant current I2 flows through the amplifier circuit 21. At the same time, the transistor Q27 is turned on so that a node A is held in the VCC level and the driver 22 is turned off.

Also in the standby mode, the control signal $\phi 1$ is taking a low level to turn transistors Q36 and Q37 OFF and ON, respectively. No current thereby flows to the amplifier circuit 31. As a result, only the current I1 is consumed by the internal power source circuit in the standby mode as a total current Isum, as shown in FIG. 2.

When the row address strobe signal RAS changes from a high level to a low level to initiate a data access operation, the control signals $\phi 0$ and $\phi 1$ are changed to a high level to activate both of the power circuits 2 and 3. As mentioned hereinbefore and further shown in FIG. 2, by the initiation of the data access, a large current Iint flows through the memory circuit 100 by the energization of word line(s) and the activation of the sense amplifiers for data sensing and restoring. Therefore, the internal power source circuit is required to have a large driving ability and a high response speed to stabilize the internal power voltage VINT. To this end, both of the power supply circuits 2 and 3 are activated in response to the corresponding high level control signals $\phi 0$ and $\phi 1$. Further, each of the driver transistors 22 and 32 is designed to have a larger size than the transistor 12 to represent a larger driving ability than the transistor 12. Moreover, transistor 32 is bigger than transistor 22 to have the largest driving ability. A ratio of drive abilities between drivers 22 and 32 may be determined based on application requirement. Furthermore, the constant currents I2 and I3 are set to be large so that there is sufficient response speed to stabilize the internal power voltage VINT at high speed during the sense and restore operations in the memory circuit 100. Thus, the current Isum flowing through the internal power source circuit is increased to a sum of I1, I2 and I3 as shown FIG. 2.

When the data sensing operation as well as the data restoring operation is completed, the control signal $\phi 1$ is changed to the low level, as shown in FIG. 2. As a result, the third power supply circuit 3 is deactivated and no current I3 flows therethrough. The memory circuit 100 is thereafter brought into a data output operation or a data write operation and thus requires a certain current. During this operation, however, the first and second power circuits 1 and 2 operates to stabilize the internal power voltage VINT. The current Isum flowing through the present internal power source circuit thereby reaches a level equivalent to a sum of I1 and I2, as shown in FIG. 2.

By changing the signal RAS to a high level to indicate the completion of the data access operation, the control signal $\phi 0$ is changed to a low level to deactivate the second power circuit 2. The current Isum consumed by the power source circuit is thus reduced to the minimum standby level I1, as shown in FIG. 2.

In the timing circuit 200, although the details are not shown, the control signal $\phi 0$ is derived by an inverter circuit receiving row address strobe signal RAS and control signal $\phi 1$ is derived by, for example, an two-input NOR gate having a first input node supplied with a signal RAS and an inverted-delay circuit receiving the signal RAS and outputting the delayed-inverted signal RAS to a second input node of the NOR gate. If desired, the series circuit consisting transistors Q36 and Q33 can be connected in parallel with the series circuit consisting transistors Q26 and Q23 in place of providing the third power supply circuit 3. Also in this modification, the substantially same effects and operations of the circuit in FIG. 1 are derived.

Figure 3:
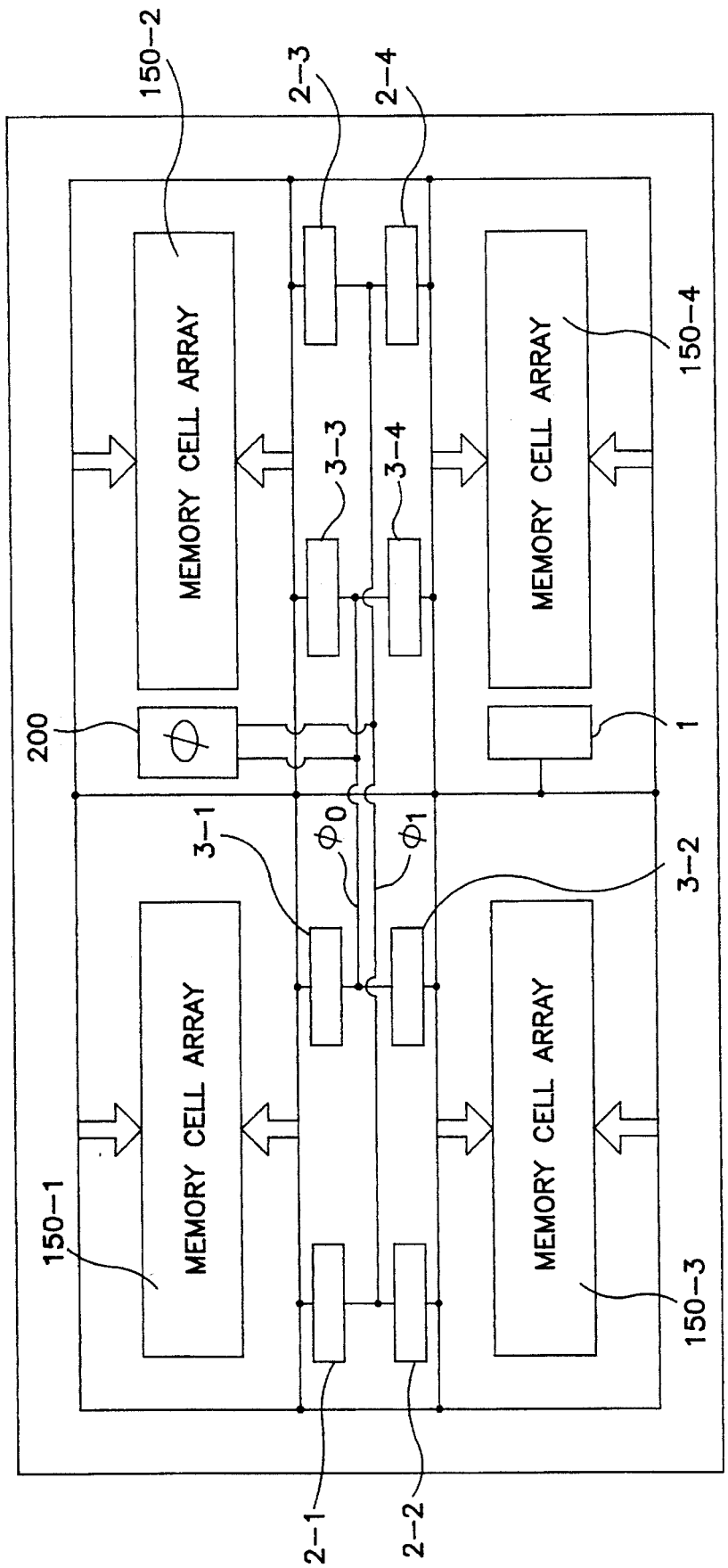
FIG. 3 is a block diagram showing a layout of the memory device shown FIG. 1.

Turning to FIG. 3, in an actual layout on a semiconductor chip of the memory device shown in FIG. 1, the memory cell array in the memory circuit 100 is divided into four blocks 150-1 to 150-4. Moreover, the internal power circuit has four second power circuits 2-1 to 2-4 each having the same circuit construction as circuit 2 shown in FIG. 1 and four power circuits 3-1 to 3-4 having the same circuit construction as circuit 3 shown in FIG. 1, and these circuits are arranged as shown in FIG. 3. The internal power voltage VINT supplied to each memory cell block 150 is thereby controlled more stably.

Figure 4:
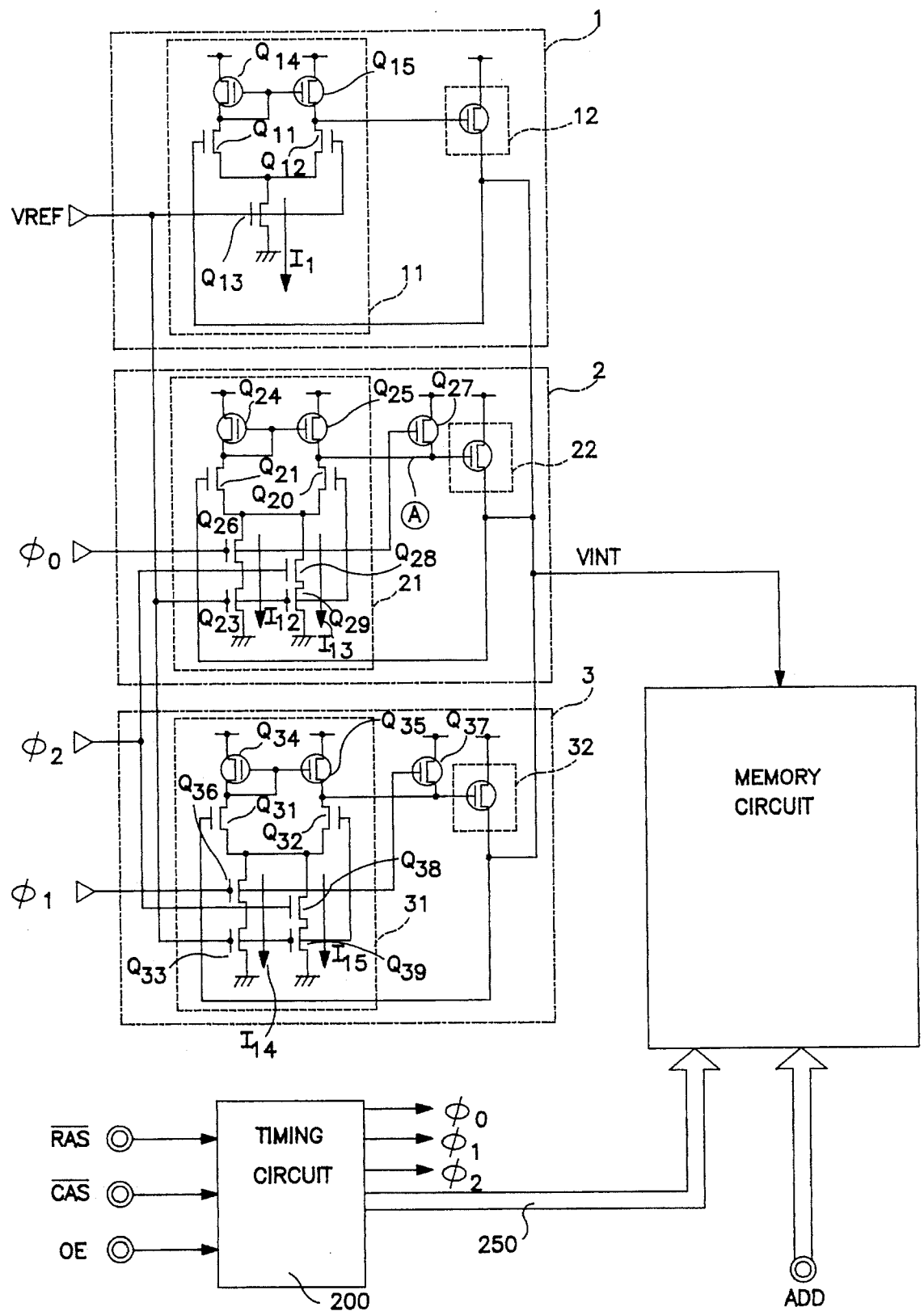
FIG. 4 is a circuit diagram showing a dynamic memory device according to another embodiment of the present invention.
Figure 5:
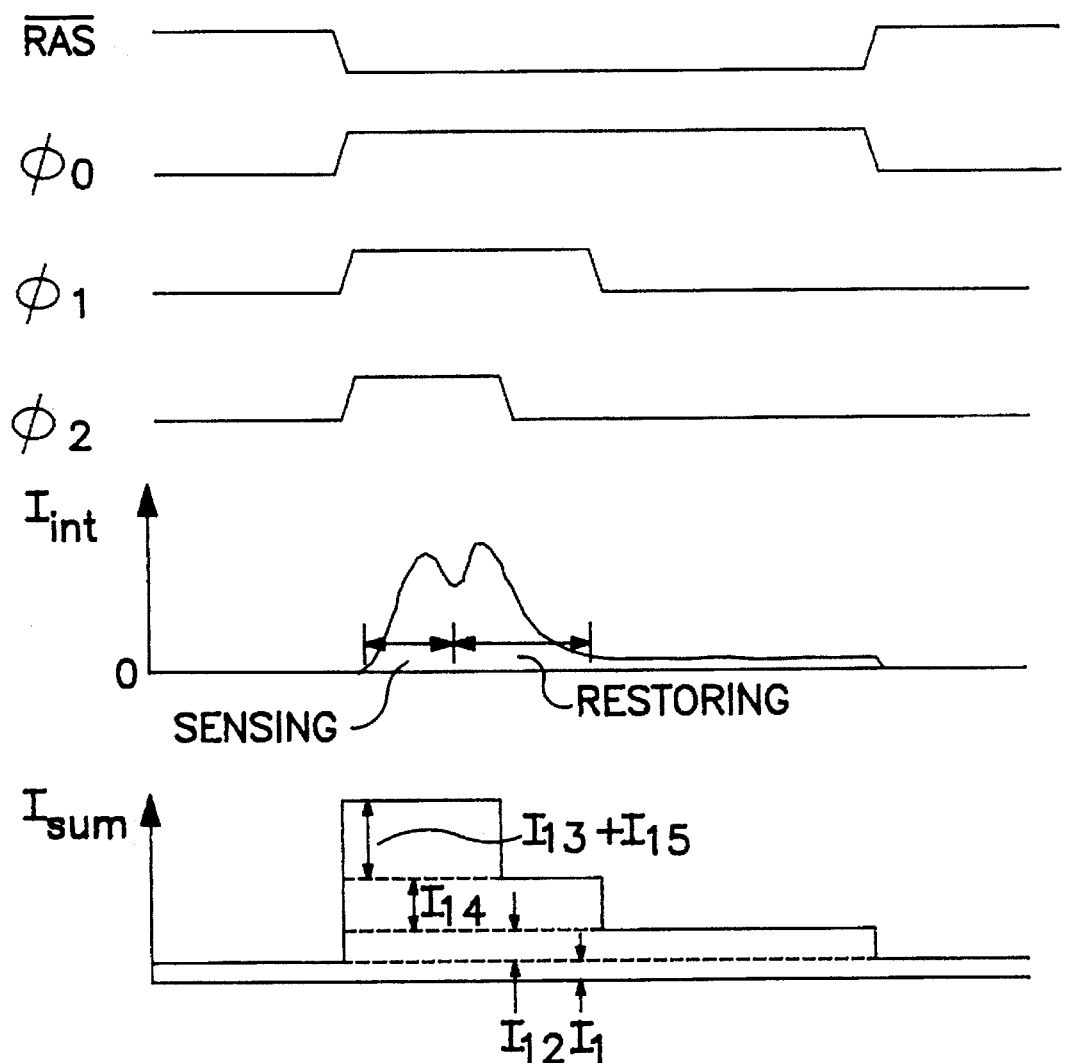
FIG. 5 is a timing diagram illustrating an operation of the memory device shown in FIG. 4.

Although the internal power source circuit of the memory device as shown in FIG. 1 has the maximum driving ability and response speed during the entire sensing and restoring operations, its driving ability and response speed might be slightly reduced after the peak current in the restoring operation state to flow. This is because a further large current is no longer required to flow through the memory circuit 100 and hence the internal power source circuit is allowed to control the internal power voltage VINT with a relatively small driving ability and response speed. Therefore a memory device as shown in FIG. 4 as another embodiment of the present invention reduces the power consumption, in which the same designates as those shown in FIG. 1 are denoted by the same reference numerals to omit further description thereof. In FIG. 4, the second power circuit 2 further includes a series connection of NMOS transistors Q28 and Q29 connected in parallel to the series circuit of transistors Q26 and Q23, and the third power circuit 3 further includes a series connection of NMOS transistors Q38 and Q39 connected in parallel to the series circuit of transistors Q36 and Q33. The gates of transistors Q29 and Q39 are supplied with the reference voltage VREF and the gates of transistors Q28 and Q38 are supplied with a third control signal φ2. This control signal φ2 is generated by the timing generator 200 in response to the row address strobe signal RAS and takes the active high level during the period covering the sensing operation and a portion of the restoring operation, during which portion the peek current flows to restore or refresh the memory cells, as shown in FIG. 5. The control signal φ2 is generated by a NOR gate and an invented-delay circuit, similar to the circuit for generating the control signal φ1. In this embodiment, the signal φ2 is designed to stay in the high level for about 20 ns.

With the circuit construction as described above, during the high level of the control signal φ2, transistors Q28 and Q38 are both turned ON to supply currents I13 and I15 to the differential amplifiers 2 and 3, respectively. During this period, the transistors Q26 and Q36 are also in the conductive state. Accordingly, the internal power source circuit has the maximum driving ability and response speed to stabilize the internal power voltage VINT against the change in large impedance of the memory circuit 100. After the change of the signal φ2 to the low level, the amplifier 3 receives only the current I14 and the amplifier 2 receives only the current I12 to stabilize the internal power voltage VINT with driving ability and response speed smaller than the above maximum driving ability and response speed. The control signal φ1 is thereafter changed to the low level. The third power circuit 3 is thereby deactivated, similar to the memory device as shown in FIG. 1. Thus, the current Isum flowing through the present internal power source circuit is changed in accordance with the sequence of the internal operations, as shown in FIG. 5.

In this embodiment, therefore, the power consumption of the internal power source circuit is further reduced without deteriorating the voltage stabilizing operation.

It is apparent that the present invention is not limited to the above embodiments but may be changed and modified without departing from the scope and spirit of the invention.

What is claimed is:

1. A semiconductor memory device having a standby mode and an active operation mode, said active operation mode including a first period following initiation of said active operation mode and a second period after said first period, said memory device comprising a memory circuit and an internal power source circuit generating and supplying an internal power voltage to said memory circuit, said internal power voltage being smaller than an external power voltage supplied to said memory device, said internal power source circuit including a power circuit for stabilizing said internal power voltage to a predetermined level with a response speed relative to a current flowing through said power circuit and a current control circuit for changing said current flowing through said power circuit to a first value during said standby mode, a second value larger than said first value during said first period of said active operation mode and a third value larger than said first value and smaller than said second value during said second period of said active operation mode.

2. The device as claimed in claim 1, wherein said memory circuit includes a timing control circuit responding to a change of a control signal from an inactive level to an active level and producing a first signal and a second signal, said first signal assuming an active level during said first period and said second signal assuming an active level during a period covering said first and second periods, said current control circuit responding to said first and second signals to change said current to said first second and third values, respectively.

3. The device as claimed in claim 2, wherein said control signal is a row address strobe signal and said change of said row address strobe signal from said inactive level to said active level initiates said active operation mode.

4. The device as claimed in claim 1, wherein said power circuit includes first, second and third current sources said current control circuit activates said first current source during said standby mode and said active operation mode, activates said second and third current sources during said first period of said active operation mode and activates said third current source during said second period of said active operation mode.

5. The device as claimed in claim 1, wherein said active operation mode further includes a third period after said second period and said current control circuit further changes said current flowing through said power circuit to a fourth value larger than said first value and smaller than said third value during said third period of said active operation mode.

6. The device as claimed in claim 5, wherein said power circuit includes first, second, third and fourth current sources and said current control circuit activates said first current source during said standby mode and said active operation mode, activates said second, third and fourth current sources during said first period of said active operation mode, activates said third and fourth current sources during said second period of said active operation mode and activates said fourth current source during said third period of said active operation mode.

7. A semiconductor memory device having a standby mode and an active operation mode, said active operation mode including a first period following initiation of said active operation mode and a second period after said first second period, said device comprising:

an internal power source circuit responding to an external power voltage applied to a first differential amplifier circuit including a first current source which is activated during said standby mode and said active operation mode to produce a first current, said first differential amplifier circuit receiving said first current and stabilizing said internal power voltage in response to a reference voltage;

a second differential amplifier circuit including a second current source which is activated during said first period to produce a second current, said second differential amplifier circuit receiving said second current and stabilizing said internal power voltage in response to said reference voltage, and a third differential amplifier circuit including a third current source which is activated during said first and second periods to produce a third current, said third differential amplifier circuit receiving said third current and stabilizing said internal power voltage in response to said reference voltage.

8. The device as claimed in claim 7, wherein said active operation mode further includes a third period between said first and second periods and said second differential amplifier circuit further includes a fourth current source which is activated during said first and third periods to produce a fourth current, said second differential amplifier circuit further receiving said fourth current and stabilizing said internal power voltage, and said third current source being further activated during said third period to produce said third current.

9. The device as claimed in claim 8, wherein said third differential amplifier circuit further includes a fifth current source activated during said first and third periods to produce a fifth current, said third differential amplifier circuit further receiving said fifth current and stabilizing said internal power voltage.

10. The device as claimed in claim 9, wherein said first differential amplifier circuit includes a first output transistor having a first driving ability, said second differential amplifier circuit including a second output transistor having a second driving ability larger than said first driving ability, and said third differential amplifier circuit having a third output transistor having a third driving ability larger than said first driving ability and smaller than said second driving ability.

* * * * *